(12) United States Patent
Nuutinen

(10) Patent No.: US 6,879,236 B1
(45) Date of Patent: Apr. 12, 2005

(54) NOISE SUPPRESSOR UNIT

(75) Inventor: Sami Nuutinen, Santa Rosa, CA (US)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/019,235

(22) PCT Filed: Jul. 6, 2000

(86) PCT No.: PCT/FI00/00627

§ 371 (c)(1),
(2), (4) Date: Feb. 15, 2002

(87) PCT Pub. No.: WO01/05202

PCT Pub. Date: Jan. 18, 2001

(30) Foreign Application Priority Data

Jul. 7, 1999 (FI) ................................................ 991558

(51) Int. Cl.$^7$ ............................................. H01F 27/28
(52) U.S. Cl. ........................ 336/229; 336/65; 336/221
(58) Field of Search ................................ 336/229, 200, 336/223, 221, 65, 232

(56) References Cited

U.S. PATENT DOCUMENTS 4,656,451 A  *  4/1987  Pomponio ..................... 336/96
5,877,666 A  *  3/1999  Johnson, Jr. et al. ....... 336/180
6,246,311 B1 *  6/2001  Finnemore et al. ......... 336/192
6,292,081 B1 *  9/2001  Armfield et al. ............. 336/65

FOREIGN PATENT DOCUMENTS

| JP | 5-299252 | 11/1993 |
| JP | 6-260341 | 9/1994 |
| JP | 7-78719 | 3/1995 |
| JP | 10-241958 | 9/1998 |

* cited by examiner

Primary Examiner—Anh Mai
(74) Attorney, Agent, or Firm—Pillsbury Winthrop LLP

(57) ABSTRACT

The invention relates to a noise suppressor unit (1) for installing and mounting a common mode choke for a noise suppressor onto a circuit board (3). The noise suppressor unit (1) comprises a circuit board holder (7), onto which the toroid (4) is positioned, the toroid being coiled with at least two coils (5), the circuit board holder (7) comprising connecting plates (8), wherein one coil end (6) at the most is or more coil ends (6) are connected to each connecting plate (8) and wherein the connecting plates (8) are intended to be surface mounted to mounting surface areas in the circuit board (3), and wherein the connecting plates (8) are electrically insulated from each other, and lifting means (9) for an assembly head or the like of an automatic assembly machine for placing the noise suppressor unit (1) onto the circuit board (3) by the automatic assembly machine.

14 Claims, 1 Drawing Sheet

NOISE SUPPRESSOR UNIT

This is the U.S. National Stage of PCT/FI00/00627, which was filed on Jul. 6, 2000 in the English language.

BACKGROUND OF THE INVENTION

The invention relates to a noise suppressor unit for installing and mounting a common mode choke for a noise suppressor onto a circuit board, the common mode choke for the noise suppressor comprising a toroid coiled with at least two coils, which coils have two coil ends.

The noise suppressor unit according to the invention can be applied, for example, to installation and mounting of a common mode choke for a noise suppressor in a power source nodule onto a circuit board of the power source module, the module being arranged onto a circuit board of a plug-in unit. A power source module is a separate current delivery device positioned onto a circuit board of a plug-in unit, the device comprising a circuit board for the power source module. Owing to the structure, which comprises two stacked circuit boards, the power source module only allows the use of especially low components in order for the combination to fit into the card slot reserved for it.

Especially the operation of a power source causes much electro-magnetic noise. The European Commission EMC directive (89/336/EEC) on electric devices determines that no device must not be disturbed by other devices nor must it disturb other devices. In the current and future telecommunications community, the fulfilment of the requirements of the directives is of utmost importance, and also constitutes, a competitive advantage. If electromagnetic noise cannot be filtered in the power source module, it propagates and may cause malfunction in the plug-in unit. As a result of this, the operation of the entire system may be disturbed. For this reason, for preventing the propagation of noise, the interface between the power source and the plug-in unit must comprise a noise filter having, among other things, a common mode choke for a noise suppressor of the power source module. The operation of the noise filter is reciprocal.

Common mode chokes for noise suppressors have previously been disposed on the circuit board of a plug-in unit. Common mode chokes for noise suppressors have previously been manually positioned onto the circuit board of the plug-in unit, and the ends of the choke coils have been soldered into openings on the circuit board of the plug-in unit.

When components are assembled onto a circuit board by modem production methods, the above conventional method cannot be used. A common mode choke for a noise suppressor has to be able to be assembled automatically and surface mounted.

BRIEF DESCRIPTION OF THE INVENTION

It is thus an object of the invention to provide a noise suppressor unit to solve the above problems.

The objects of the invention are achieved by a noise suppressor unit, which is characterized in that the noise suppressor unit comprises a circuit board holder, onto which the toroid is positioned, the toroid being coiled with at least two coils, the circuit board holder comprising connecting plates, wherein one coil end at the most is or more coil ends are connected to each connecting plate and wherein the connecting plates are intended to be surface mounted to mounting surface areas in the circuit board, and wherein the connecting plates are electrically insulated from each other, and lifting means for an assembly head or the like of an automatic assembly machine for placing the noise suppressor unit onto the circuit board by the automatic assembly machine or the like.

The preferred embodiments of the invention are disclosed in the dependent claims.

The invention is based or placing and mounting the common mode choke for the noise suppressor onto the circuit board holder so as to achieve a noise suppressor unit which functions as an installation and mounting holder of the common mode choke for the noise suppressor. This circuit board holder provides a common mode choke for a noise suppressor, which is both automatically assembled and surface mounted.

Such packages are commercially available that allow automated assembly and surface mounting of a common mode choke for a noise suppressor, but owing to the two-piece holder+cover structure of the packages, the components become too high and exceed the maximum height allowed for components, especially in cases where the common mode choke for the noise suppressor is a common mode choke for a noise suppressor in a power source module, the choke being positioned onto a circuit board of the power source module arranged onto a circuit board of a plug-in unit. In the noise suppressor unit of the invention the component height does not create a problem, since the circuit board can be made thin.

The noise suppressor unit of the invention also provides the advantage that it has a simple structure; the circuit board holder, for instance, is made of one piece. Owing to the simplicity of the circuit board holder it is advantageous to manufacture.

Due to the circuit board structure and the connecting plates in the circuit board holder, the noise suppressor unit of the invention does not comprise any mounting feet, like the conventional surface mounted/mountable components do, and therefore the surface area taken by the common mode choke for the noise suppressor remains small.

The connecting plates of the circuit board holder cool and efficiently transfer the heat caused by the common mode choke for the noise suppressor to the cooling layers of the circuit board of the power source. Efficient cooling enables the use of the circuit board holder in high-power applications.

BRIEF DESCRIPTION OF THE DRAWINGS

In the following the invention will be described in greater detail in connection with preferred embodiments with reference to the attached drawings, in which.

DETAILED DESCRIPTION OF THE INVENTION

The invention relates to a noise suppressor unit 1 for installing and mounting a common mode choke (not marked with a reference number) for a noise suppressor onto a circuit boards 3.

Figure 1:
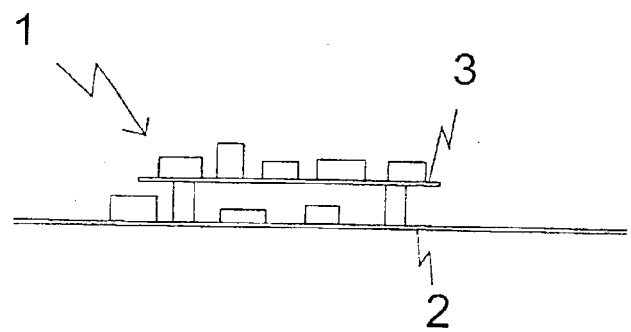
FIG. 1 shows a power source module arranged onto a plug-in unit.

FIG. 1 shows a structure in which the circuit board 3 is a circuit board of a power source module, the circuit board being arranged onto a circuit board 2 of a plug-in unit.

The common mode choke for the noise suppressor comprises a toroid 4 coiled with at least two coils 5 such that each coil 5 has two coil ends 6.

The noise suppressor unit 1 comprises a circuit board holder 7, upon which the toroid 4 coiled with at least two coils 5 is positioned.

The circuit board holder 7 comprises connecting plates 8. One coil end 6 at the most is or more coil ends 6 are connected to each connecting plate 8. This means that one or more coil ends 6 can be connected to one connecting plate 8, or no coil end 6 is connected thereto. The connecting plates 8 are also intended to be surface mounted to mounting surface areas, such as copper areas (not shown), on the circuit board 3. The connecting plates 8 are electrically insulated from each other.

The noise suppressor unit 1 further comprises lifting means 9 for an assembly head (not shown) or the like of an automatic assembly machine for placing the noise suppressor unit 1 onto the circuit board 3 by the automatic assembly machine or the like (not shown).

The connecting plates 8 are preferably so dimensioned and designed that the toroid 4 is apart and does not touch the connecting, plates 8. Such a solution provides a better functioning noise suppressor unit 1.

Each connecting plate 8 comprises more preferably an upper connecting plate 10, to which one coil end 6 at the most is connected, and a lower connecting plate 11, which is in an electrical connection with the upper connecting plate 10 and which is intended to be surface mounted to conductors in the circuit board 3. The upper connecting plate 10 can, for example, be connected to the lower connecting plate 111 by a circuit board through (not shown).

The circuit board holder 7 is preferably a two-layer circuit bard.

Figure 2:
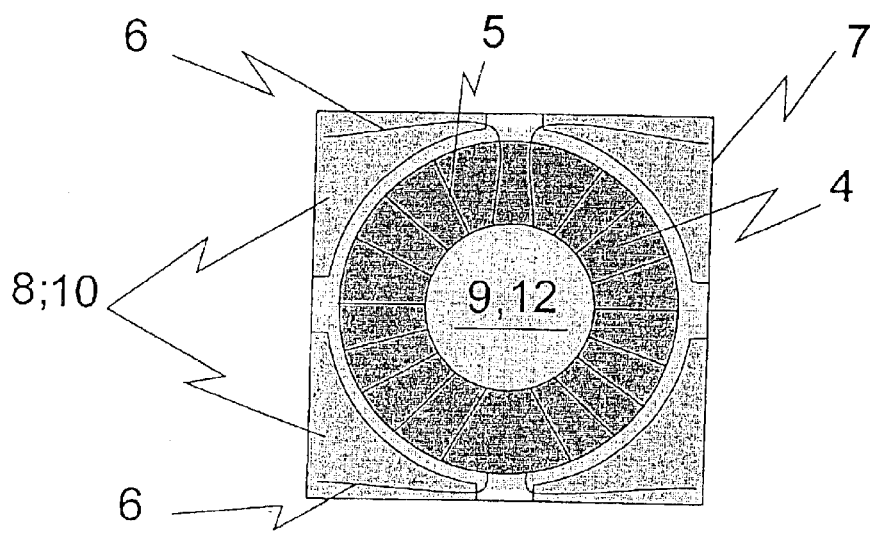
FIG. 2 is a top view of a noise suppressor unit.

In FIG. 2, the upper connecting plates 10 are so dimensioned and designed that the toroid 4 is apart find does not touch the upper connecting plates 10. Such a solution provides a better functioning noise suppressor unit 1.

Figure 3:
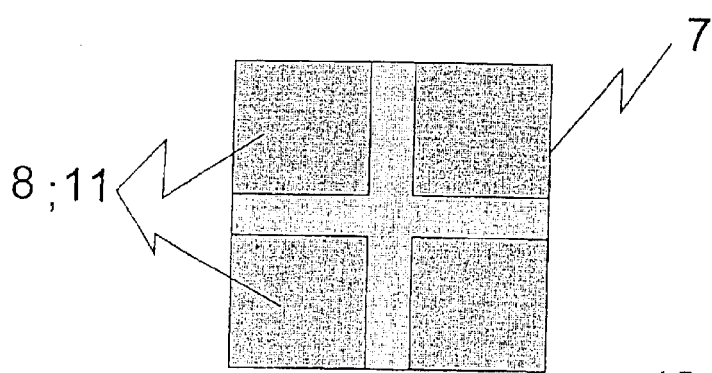
FIG. 3 is a bottom view of the noise suppressor unit.
Figure 4:
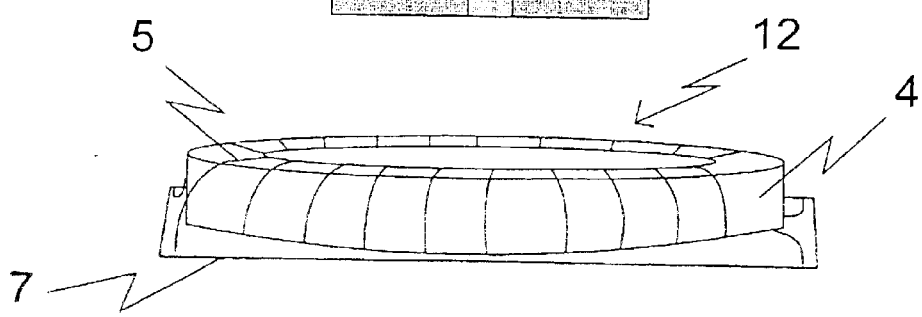
FIG. 4 is a side view of the noise suppressor unit.

In FIG. 3, the lower connecting plates 11 are substantially rectangular.

The upper connecting plates 10 and the lower connecting plates 11 are preferably made as big as possible so as to cool more efficiently and to transfer the heat caused by the common mode choke for the noise suppressor to the cooling layers (not shown) of the circuit board of the power source.

The common mode choke for the noise suppressor shown in FIG. 2 comprises two coils 5 and four connecting plates 8.

The circuit board holder 7 shown in the figures is substantially rectangular. Each connecting plate 8 is located at one corner of the circuit board holder 7.

The connecting plates 8 are preferably made of copper or copper metal.

The lifting means 9 are preferably in the middle opening 12 of the toroid 4 and preferably on the surface of the circuit board holder 7. This solution provides a simple noise suppressor unit 1.

The noise suppressor unit 1 of the invention is assembled and mounted onto the circuit board 3 for example in the following manner. The lifting means 9, from which a strainer of the assembly machine grabs the noise suppressor unit 1, are in the middle opening 12 of the toroid 4 on the surface of the circuit board holder 7. The diameter of the strainer (not shown) of the assembly machine can be about a half of the diameter of the middle opening 12 of the toroid 4. During assembling the strainer of the assembly machine is pushed into the middle opening 12 of the toroid 4 and grabs the upper surface of the circuit board holder 7 for example with its suction head and transfers the noise suppressor unit 1 from a component pallet (not shown) to the circuit board 3. On the circuit board 3 of the power supply module, each connecting plate 8 of the noise suppressor unit 1 is connected to a corresponding copper surface area (not shown) on the circuit board 3 by means of a copper joint, for example. Thus, each coil end 6 of the common mode choke for the noise suppressor has the same electric potential as the corresponding copper surface area at the bottom of the noise suppressor unit 1 of the invention.

It is obvious to those skilled in the art that as technology advances, the basic idea of the invention may be implemented in a variety of ways. Accordingly, the invention and its embodiments are not restricted to the above-described examples, but may vary within the scope of the claims.

What is claimed is:

1. A noise suppressor unit comprising:

a circuit board base, a toroid coiled with at least two coils, each coil comprising two coil ends, connecting plates that are electrically insulated from each other, wherein, the toroid is positioned on the circuit board base, each of the coil ends is connected to one of the connecting plates, the connecting plates being positioned to form electrical connections with a circuit board.

2. A noise suppressor unit as claimed in claim 1, wherein the connecting plates are so dimensioned and designed that the toroid is apart from the connecting plates.

3. A noise suppressor unit as claimed in claim 1, wherein each connecting plate comprises an upper connecting plate, to which one coil end at the most is connected, and a lower connecting plate, which is in an electrical connection with the upper connecting plate and which is intended to be surface mounted to mounting surface areas in the circuit board.

4. A noise suppressor unit as claimed in claim 3, wherein the upper connecting plates are so dimensioned and designed that the toroid is apart from the upper connecting plates.

5. A noise suppressor unit as claimed in claim 3, wherein the lower connecting plates are substantially rectangular.

6. A noise suppressor unit as claimed in claim 1, wherein the noise suppressor unit comprises four connecting plates and the toroid is coiled with two coils.

7. A noise suppressor unit as claimed in claim 6, wherein the circuit board base is substantially rectangular and each connecting plate is located at one corner of the circuit board base.

8. A noise suppressor unit as claimed in claim 1, wherein the connecting plates are made of copper or copper metal.

9. A noise suppressor unit according to claim 1 wherein the suppressor unit has a place for lifting means to grab the noise suppressor unit.

10. A noise suppressor unit as claimed in claim 9, wherein the place for lifting means is located in the middle opening of the toroid.

11. A noise suppressor unit as claimed in claim 9, wherein the place for lifting means is located on the surface of a circuit board holder.

12. The noise suppressor unit of claim 1, wherein the toroid coiled with at least two coils forms a common on mode choke.

13. A noise suppressor unit comprising:
- a circuit board base configured to be positioned on a circuit board,
- a toroid positioned on the circuit board base,
- a place for lifting means to grab the noise suppressor unit, the place being located at the middle opening of the toroid, on the surface of the circuit board base.

14. A noise suppressor unit comprising:
- a toroid; and
- an intermediary connecting base on which said toroid is positioned, said intermediary connecting base being configured to connect said toroid to a circuit board,
- wherein said intermediary connecting base includes a surface portion located at the middle of said toroid, said surface portion and said toroid being dimensioned so as to allow a lifting unit to grab said noise suppressor unit.

* * * * *